(12) United States Patent
Sandhu et al.

(10) Patent No.: US 7,547,599 B2
(45) Date of Patent: Jun. 16, 2009

(54) MULTI-STATE MEMORY CELL

(75) Inventors: Gurtej S. Sandhu, Boise, ID (US); Mirzafer Abatchev, Boise, ID (US)

(73) Assignee: Micron Technology, Inc., Boise, ID (US)

(*) Notice: Subject to any disclaimer, the term of this patent is extended or adjusted under 35 U.S.C. 154(b) by 298 days.

(21) Appl. No.: 11/138,575

(22) Filed: May 26, 2005

(65) Prior Publication Data
US 2006/0267075 A1    Nov. 30, 2006

(51) Int. Cl.
*H01L 21/336* (2006.01)

(52) U.S. Cl. .................. 438/257; 438/157; 438/182; 438/195; 257/315; 257/E21.179; 257/E21.422; 257/E21.68

(58) Field of Classification Search .............. 438/157, 438/176, 182, 195, 283, 201, 211, 593, 197, 438/257; 257/315, 320, E21.179, E21.422, 257/E21.68, E21.687, E21.623
See application file for complete search history.

(56) References Cited

U.S. PATENT DOCUMENTS

| | | | | |
|---|---|---|---|---|
| 5,328,810 A | * | 7/1994 | Lowrey et al. | 430/313 |
| 5,650,343 A | * | 7/1997 | Luning et al. | 438/301 |
| 5,688,704 A | * | 11/1997 | Liu | 438/303 |
| 5,714,412 A | * | 2/1998 | Liang et al. | 438/266 |
| 6,344,993 B1 | | 2/2002 | Harari et al. | |
| 6,847,068 B2 | | 1/2005 | Chuang et al. | |
| 6,903,405 B2 | * | 6/2005 | Takahashi | 257/314 |
| 6,939,767 B2 | | 9/2005 | Hoefler et al. | |
| 6,995,063 B2 | * | 2/2006 | Park | 438/257 |
| 2004/0087139 A1 | * | 5/2004 | Yeh et al. | 438/636 |
| 2005/0085090 A1 | * | 4/2005 | Mui et al. | 438/714 |
| 2005/0087892 A1 | * | 4/2005 | Hsu et al. | 257/909 |
| 2005/0153502 A1 | * | 7/2005 | Kim et al. | 438/201 |
| 2005/0180217 A1 | | 8/2005 | Ding | |
| 2005/0194627 A1 | | 9/2005 | Nomoto et al. | |
| 2005/0227434 A1 | * | 10/2005 | Wu et al. | 438/257 |

* cited by examiner

Primary Examiner—Matthew Smith
Assistant Examiner—Su C Kim
(74) Attorney, Agent, or Firm—Leffert Jay & Polglaze, P.A.

(57) ABSTRACT

Floating-gate memory cells having a split floating gate facilitate decreased sensitivity to localized defects in the tunnel dielectric layer and/or the intergate dielectric layer. Such memory cells also permit storage of more than one bit per cell. Methods of the various embodiments facilitate fabrication of floating gate segments having dimensions less than the capabilities of the lithographic processed used to form the gate stacks.

25 Claims, 7 Drawing Sheets

MULTI-STATE MEMORY CELL

TECHNICAL FIELD OF THE INVENTION

The present invention relates generally to semiconductor memory devices, and in particular, the present invention relates to multi-state memory cells having a segmented floating gate.

BACKGROUND OF THE INVENTION

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

One type of memory is a non-volatile memory known as Flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

To meet demands for higher capacity memories, designers continue to strive for decreasing the size of individual memory cells. However, as device size decreases, the thickness of the tunnel dielectric layer must also generally decrease. This, in turn, results in increasing risk of failure in the tunnel dielectric layer and charge leakage from the floating gate.

In addition, multi-state memory cells are becoming more prevalent, allowing designers to further increase storage density. Multi-state memory cells, such as NROM (nitride read-only memory) or SONOS (silicon oxide nitride oxide silicon) memory cells utilize localized charge trapping in a nitride layer to alter the threshold voltage of a field-effect transistor. Because the charge is localized, the cell can exhibit a first threshold voltage when read in a forward direction and a second threshold voltage when read in a reverse direction, enabling the cell to store four data values, i.e., 00, 01, 10 and 11.

For the reasons stated above, and for other reasons stated below which will become apparent to those skilled in the art upon reading and understanding the present specification, there is a need in the art for alternative memory device structures and methods of forming memory devices.

SUMMARY OF THE INVENTION

The above-mentioned problems with memory devices and other problems are addressed by the present invention and will be understood by reading and studying the following specification.

The various embodiments involve floating-gate memory cells having a split floating gate, in which the floating gate includes discrete segments. This configuration facilitates decreased sensitivity to localized defects in the tunnel dielectric layer and/or the intergate dielectric layer. Such memory cells also permit storage of more than one bit per cell by facilitating localized charge storage, even if the floating gate is formed of a material prone to charge migration. Methods of the various embodiments facilitate fabrication of floating gate segments having dimensions less than the capabilities of the lithographic processed used to form the gate stacks.

For one embodiment, the invention provides a floating-gate memory cell. The memory cell includes a tunnel dielectric layer overlying a semiconductor substrate and two or more segments of a floating-gate layer overlying the tunnel dielectric layer, wherein the segments of the floating-gate layer are separated from each other. The memory cell further includes an intergate dielectric layer overlying the floating-gate layer, a control gate layer overlying the intergate dielectric layer and source/drain regions formed in the substrate adjacent the tunnel dielectric layer.

For another embodiment, the invention provides a method of forming a floating gate for a floating-gate memory cell. The method includes forming a support layer overlying a tunnel dielectric layer, forming a cap layer overlying the support layer, and patterning the cap layer and support layer, leaving the tunnel dielectric layer intact. The method further includes removing a portion of the support layer under the patterned cap layer, removing the cap layer, forming spacers on sidewalls of a remaining portion of the support layer, wherein the spacers are formed of a material capable of storing a charge, and removing the remaining portion of the support layer.

For a further embodiment, the invention provides a method of writing to a memory cell. The method includes establishing a programming field between a control gate and a first source/drain region of the memory cell and storing charge in a first discrete segment of a floating gate of the memory cell without materially affecting a charge level of a second discrete segment of the floating gate. The first discrete segment is adjacent the first source/drain region of the memory cell and the second discrete segment is adjacent a second source/drain region of the memory cell.

The invention still further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and equivalents thereof.

Figure 1:
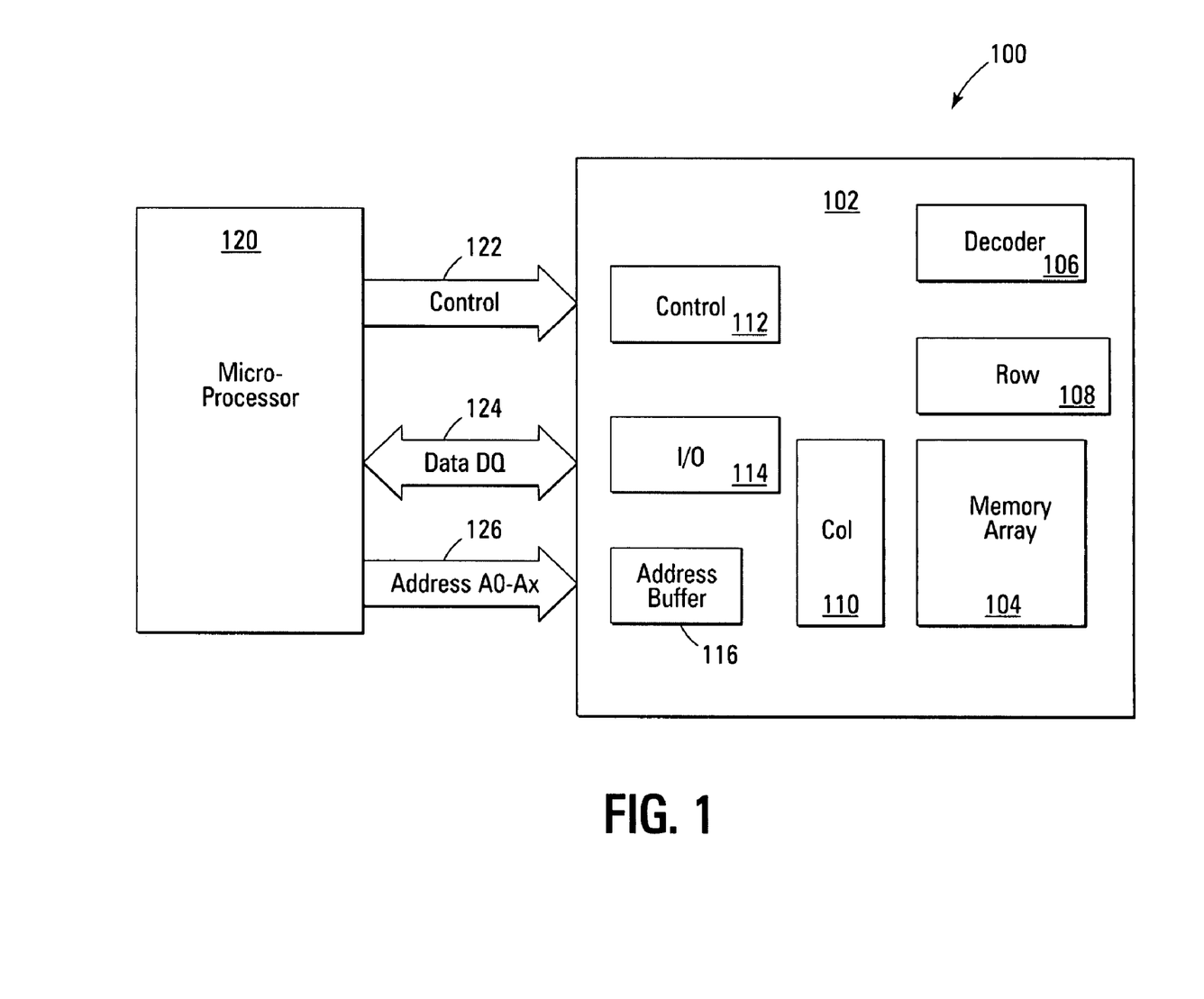
FIG. 1 is a simplified block diagram of a memory system in accordance with an embodiment of the invention.

FIG. 1 is a simplified block diagram of a memory system 100, according to an embodiment of the invention. Memory system 100 includes an integrated circuit flash memory device 102 that includes an array of floating-gate memory cells 104, an address decoder 106, row access circuitry 108, column access circuitry 110, control circuitry 112, Input/Output (I/O) circuitry 114, and an address buffer 116. Memory system 100 includes an external microprocessor 120, or memory controller, electrically connected to memory device 102 for memory accessing as part of an electronic system. The memory device 102 receives control signals from the processor 120 over a control link 122. The memory cells are used to store data that are accessed via a data (DQ) link 124. Address signals are received via an address link 126 that are decoded at address decoder 106 to access the memory array 104. Address buffer circuit 116 latches the address signals. The memory cells are accessed in response to the control signals and the address signals. It will be appreciated by those skilled in the art that additional circuitry and control signals can be provided, and that the memory device of FIG. 1 has been simplified to help focus on the invention. The memory array 104 includes split-gate memory cells in accordance with the invention. The memory array 104 can include a variety of architectures, such as a NAND architecture or a NOR architecture.

Figure 2:
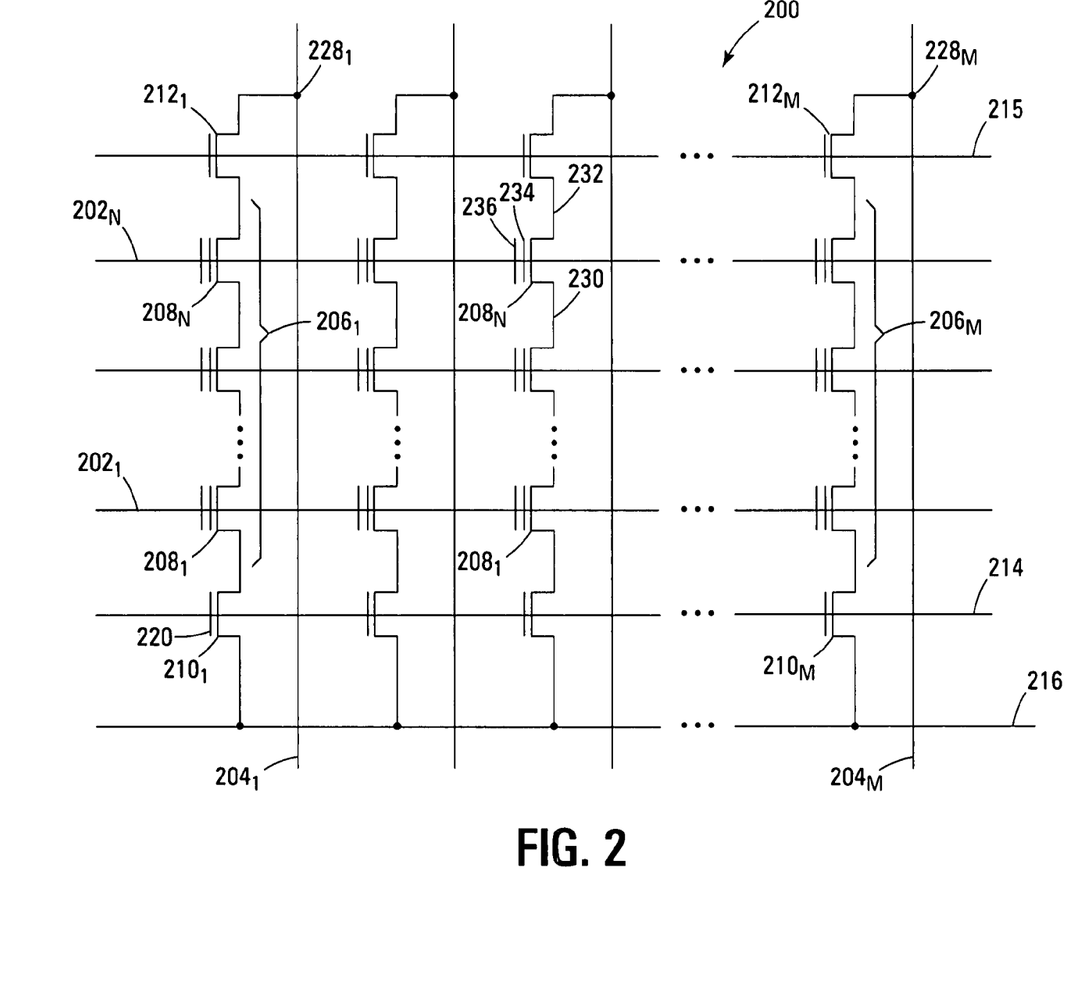
FIG. 2 is a schematic of a NAND memory array in accordance with an embodiment of the invention.

FIG. 2 is a schematic of a NAND memory array 200 as a portion of memory array 104 of FIG. 1 in accordance with another embodiment of the invention. As shown in FIG. 2, the memory array 200 includes word lines $202_1$ to $202_N$ and intersecting local bit lines $204_1$ to $204_M$. For ease of addressing in the digital environment, the number of word lines 202 and the number of bit lines 204 are each some power of two, e.g., 256 word lines 202 by 4,096 bit lines 204. The local bit lines 204 are coupled to global bit lines (not shown) in a many-to-one relationship.

Memory array 200 includes NAND strings $206_1$ to $206_M$. Each NAND string includes floating-gate transistors $208_1$ to $208_N$, each located at an intersection of a word line 202 and a local bit line 204. The floating-gate transistors 208 represent non-volatile memory cells for storage of data. The floating-gate transistors 208 of each NAND string 206 are connected in series source to drain between a source select gate 210, e.g., a field-effect transistor (FET), and a drain select gate 212, e.g., an FET. Each source select gate 210 is located at an intersection of a local bit line 204 and a source select line 214, while each drain select gate 212 is located at an intersection of a local bit line 204 and a drain select line 215.

A source of each source select gate 210 is connected to a common source line 216. The drain of each source select gate 210 is connected to the source of the first floating-gate transistor 208 of the corresponding NAND string 206. For example, the drain of source select gate $210_1$ is connected to the source of floating-gate transistor $208_1$ of the corresponding NAND string $206_1$. A control gate 220 of each source select gate 210 is connected to source select line 214.

The drain of each drain select gate 212 is connected to a local bit line 204 for the corresponding NAND string at a drain contact 228. For example, the drain of drain select gate $212_1$ is connected to the local bit line $204_1$ for the corresponding NAND string $206_1$ at drain contact $228_1$. The source of each drain select gate 212 is connected to the drain of the last floating-gate transistor 208 of the corresponding NAND string 206. For example, the source of drain select gate $212_1$ is connected to the drain of floating-gate transistor $208_N$ of the corresponding NAND string $206_1$.

Typical construction of floating-gate transistors 208 includes a source 230 and a drain 232, a floating gate 234, and a control gate 236, as shown in FIG. 2. Floating-gate transistors 208 have their control gates 236 coupled to a word line 202. A column of the floating-gate transistors 208 are those NAND strings 206 coupled to a given local bit line 204. A row of the floating-gate transistors 208 are those transistors commonly coupled to a given word line 202.

Figure 3:
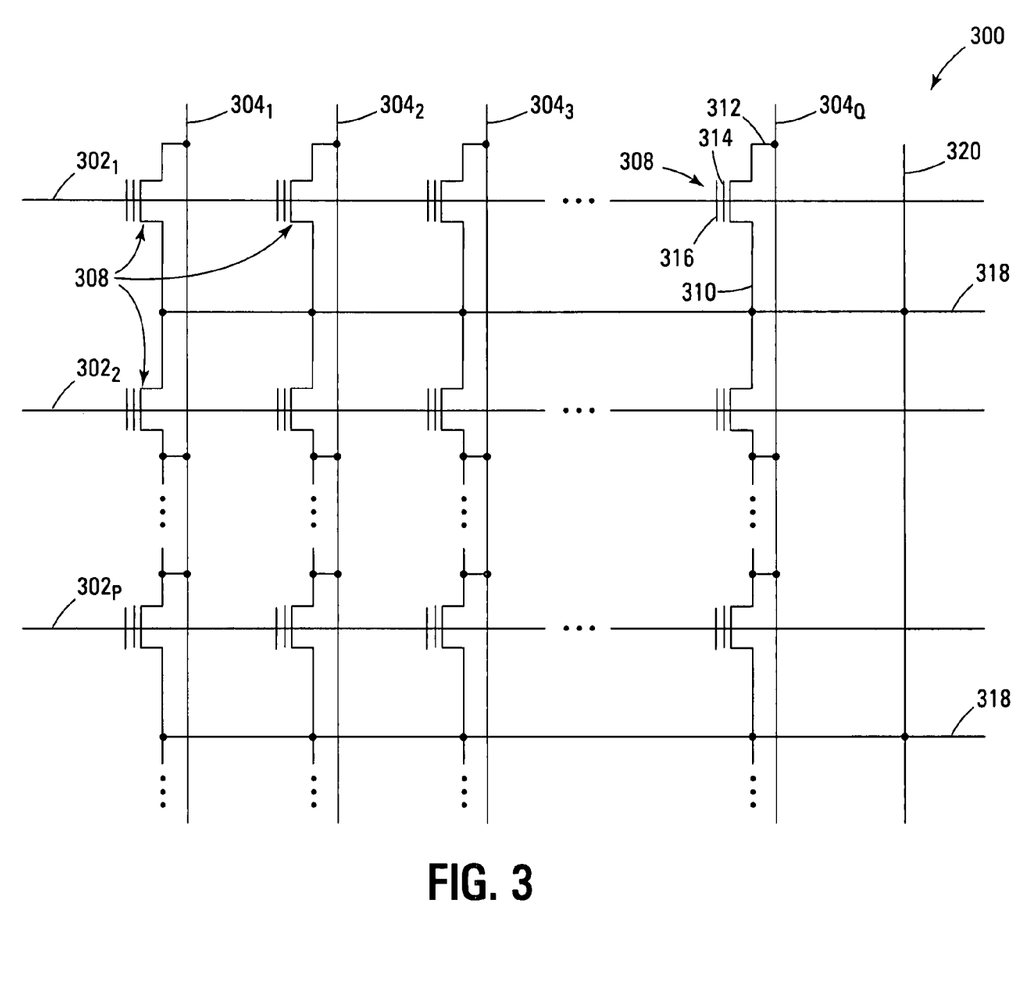
FIG. 3 is a schematic of a NOR memory array in accordance with an embodiment of the invention.

FIG. 3 is a schematic of a NOR memory array 300 as a portion of memory array 104 of FIG. 1 in accordance with another embodiment of the invention. Memory array 300 includes word lines $302_1$ to $302_P$ and intersecting local bit lines $304_1$ to $304_Q$. For ease of addressing in the digital environment, the number of word lines 302 and the number of bit lines 304 are each some power of two, e.g., 256 word lines 302 by 4,096 bit lines 304. The local bit lines 304 are coupled to global bit lines (not shown) in a many-to-one relationship.

Floating-gate transistors 308 are located at each intersection of a word line 302 and a local bit line 304. The floating-gate transistors 308 represent non-volatile memory cells for storage of data. Typical construction of such floating-gate transistors 308 includes a source 310 and a drain 312, a floating gate 314, and a control gate 316.

Floating-gate transistors 308 having their control gates 316 coupled to a word line 302 typically share a common source depicted as array source 318. As shown in FIG. 3, floating-gate transistors 308 coupled to two adjacent word lines 302 may share the same array source 318. Floating-gate transistors 308 have their drains 312 coupled to a local bit line 304. A column of the floating-gate transistors 308 includes those transistors commonly coupled to a given local bit line 304. A row of the floating-gate transistors 308 includes those transistors commonly coupled to a given word line 302.

To reduce problems associated with high resistance levels in the array source 318, the array source 318 may be regularly coupled to a metal or other highly conductive line to provide a low-resistance path to ground. The array ground 320 serves as this low-resistance path.

Figure 4A:
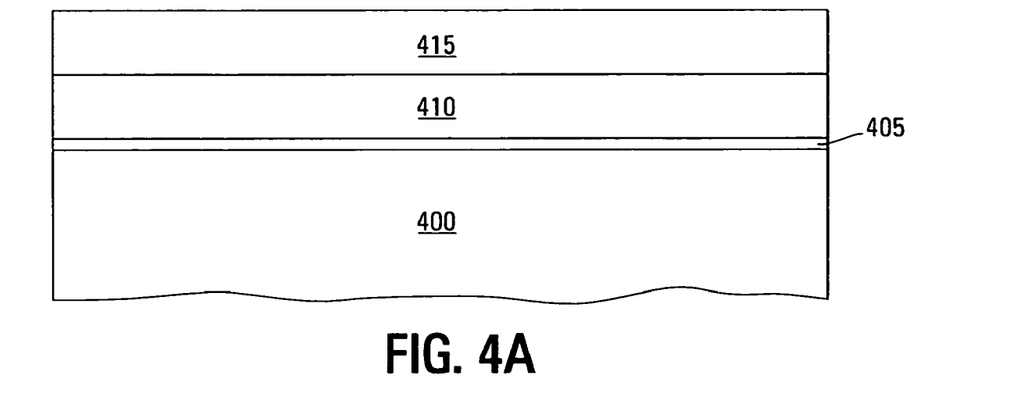
FIGS. 4A-4I are cross-sectional views of a memory cell at various stages of fabrication in accordance with one embodiment of the invention.

FIGS. 4A-4I are cross-sectional views of a memory cell at various stages of fabrication in accordance with one embodiment of the invention. These figures generally depict a method of forming a portion of a memory array in accordance with one embodiment of the invention. FIG. 4A depicts a portion of the memory array after several processing steps have occurred. In general, FIG. 4A depicts a semiconductor substrate 400 upon which tunnel dielectric layer 405, a support layer 410 and a cap layer 415 have been formed. For one embodiment, the substrate 400 is a monocrystalline silicon substrate. For a further embodiment, substrate 400 is a P-type monocrystalline silicon substrate.

The tunnel dielectric layer 405 is formed overlying an active region of the substrate 400, over which memory cells will be formed. The tunnel dielectric layer 405 might be formed by thermal oxidation of the silicon substrate 400. Alternatively, the tunnel dielectric layer 405 could be formed by a blanket deposition of a dielectric material, such as by chemical vapor deposition (CVD), physical vapor deposition (PVD) or atomic layer deposition (ALD). Tunnel dielectric layer 405 is generally a silicon oxide, but may include other dielectric materials.

The support layer 410 will provide supports upon which the floating gate will be formed. The support layer 410 is preferably a carbon layer, such as an amorphous or crystalline carbon layer, but could also include other materials exhibiting high selectivity to the tunnel dielectric layer 405, cap layer 415 and a future floating-gate layer. Carbon layers can be formed by such methods as CVD techniques or PVD techniques. As one example, plasma CVD is performed using a hydrocarbon feed gas as the carbon source. As another example, the carbon layer can be formed by sputtering, a form of PVD, using a carbon target.

The cap layer 415 is formed overlying the support layer 410 to protect its upper surface during subsequent processing. In general, cap layer 415 is of a material that will be substantially resistant to techniques subsequently used to remove portions of the support layer 415. For one embodiment, the support layer 415 is a silicon nitride material.

Figure 4B:
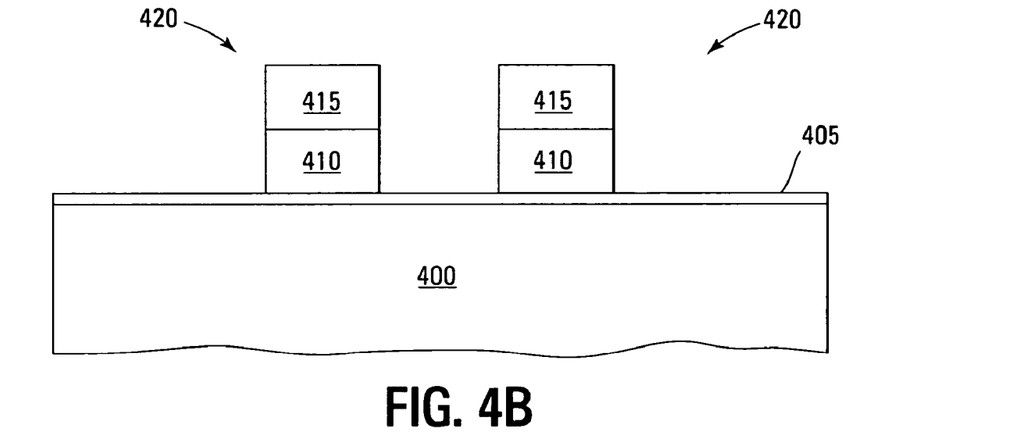

In FIG. 4B, islands 420 of the support layer 410 and cap layer 415 are formed. Such structures can be formed by such methods as photolithography, which is well understood in the art. For example, a photoresist layer (not shown) may be formed overlying the cap layer 415 and patterned to expose portions of the cap layer 415 for removal. These exposed areas may then be removed anisotropically, such as by ion etching or the like, leaving the islands 420 as shown in FIG. 4B. The removal process should be selective to the support layer 410 and the cap layer 415 to avoid removing the tunnel dielectric layer 405.

Figure 4C:
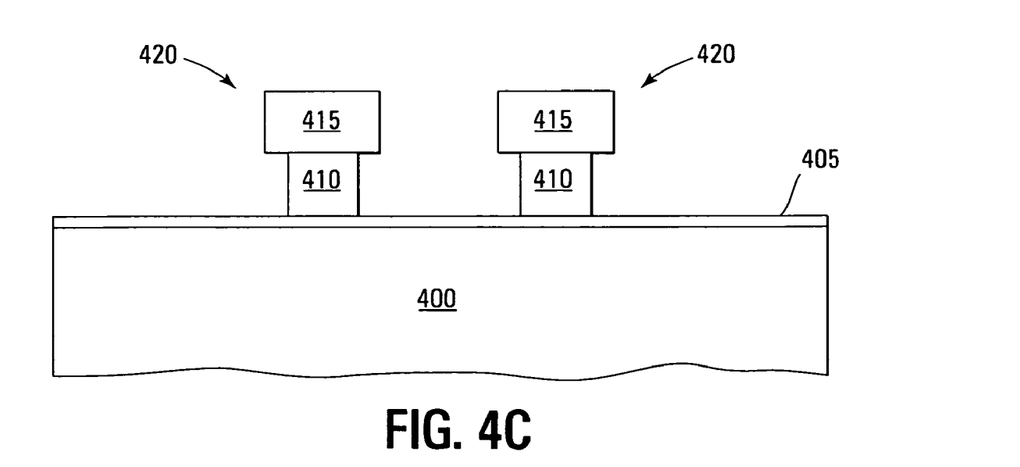

In FIG. 4C, the further portions of the support layer 410 are removed using an isotropic removal, such as dry etching or, more specifically, an oxygen ($O_2$) plasma etch. In this manner, the width of the sections of the support layer 410 are reduced relative to the width of the islands 420. A reduction of the width of the sections of the support layer 410 in this manner facilitates formation of these sections having a width that is less than the capability of the lithography methods used.

Figure 4D:
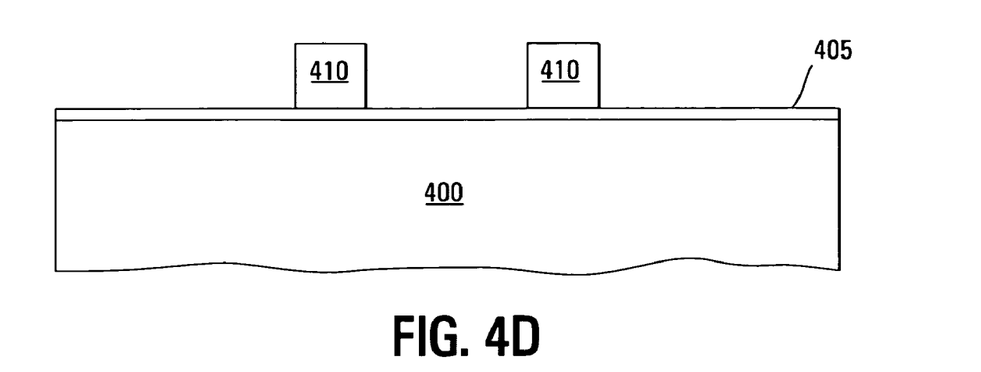
Figure 4E:
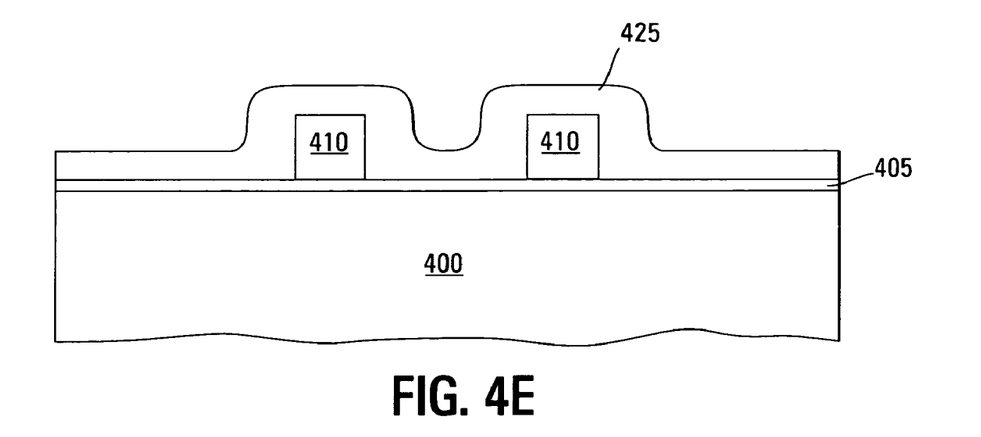

In FIG. 4D, the cap layer 415 is removed. Examples for removal include chemical and ion etching selective to the material of the cap layer. In FIG. 4E, a floating-gate layer 425 is formed. The floating-gate layer 425 is preferably a polysilicon (polycrystalline silicon) layer, but could also include other forms of doped or undoped silicon materials, such as monocrystalline silicon, nanocrystalline silicon and amorphous silicon, as well as other materials capable of holding a charge. The floating-gate layer 425 may be formed by such techniques as CVD, plasma-enhanced CVD (PECVD), PVD or ALD, and may be conductively doped during or following formation. The chosen deposition technique should result in a build-up of material on the sides of the sections of the support layer 410, i.e., a blanket deposition of material.

Figure 4F:
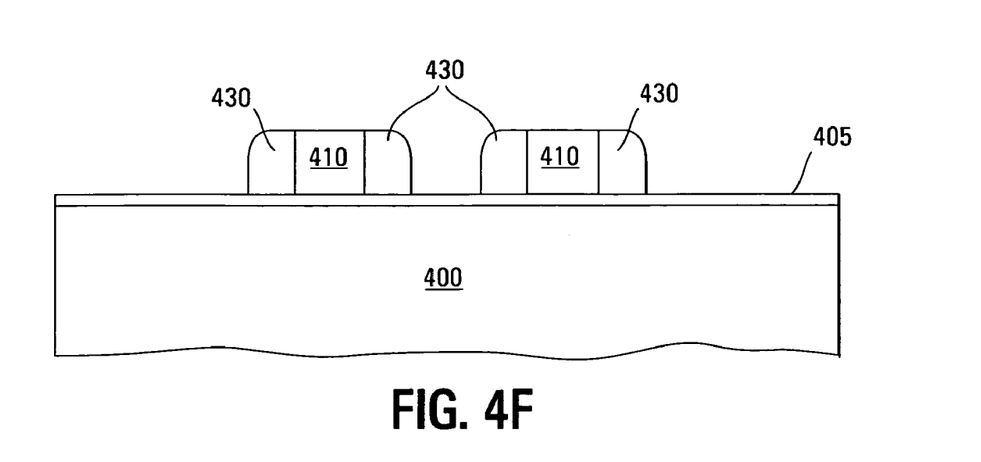
Figure 4G:
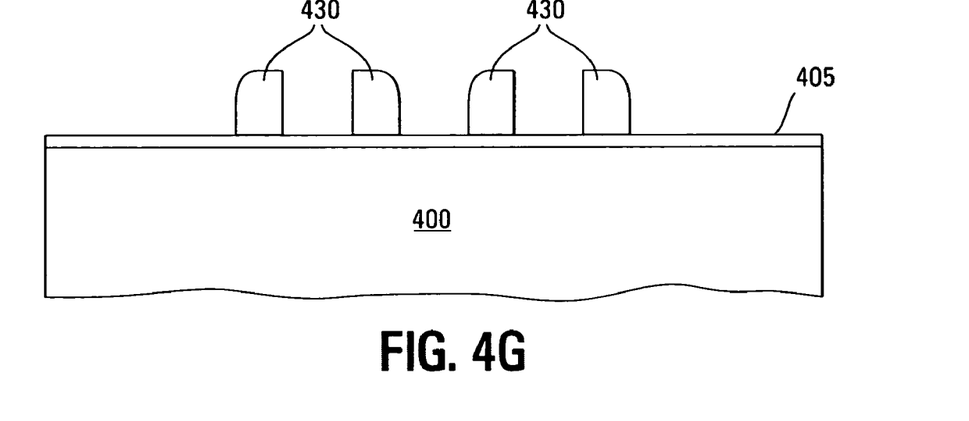

In FIG. 4F, portions of the floating-gate layer 425 are removed using an anisotropic removal technique, such as ion etching, to leave spacers or segments 430 of the floating-gate layer 425 on the sides of the sections of support layer 410, thereby exposing an upper surface of the sections of the support layer 410. In FIG. 4G, the sections of support layer 410 are removed, leaving the segments 430 free standing. For a carbon support layer 410, another $O_2$ plasma etch or the like may be used. The segments 430 of the floating-gate layer 425 will form the split floating gate of the future memory cell.

Figure 4H:
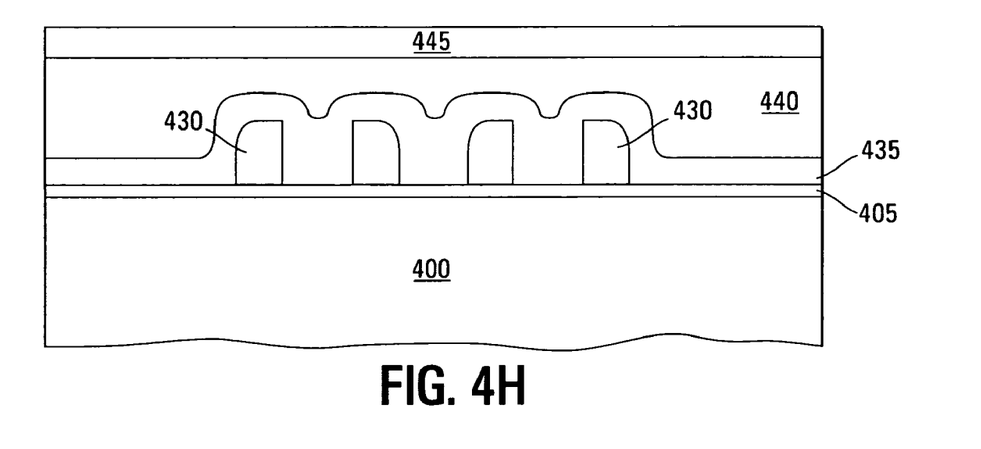

In FIG. 4H, an intergate dielectric layer 435 is then formed overlying the floating-gate layer or segments 430. Because of the separation of the segments 430 of the floating-gate layer, at least a portion of the intergate dielectric layer 435 will be formed adjacent or on the tunnel dielectric layer 405 between the segments 430. The intergate dielectric layer 435 may be one or more layers of dielectric material. For example, the intergate dielectric layer 435 could be of a multi-layer dielectric material commonly referred to as ONO (oxide-nitride-oxide). Other dielectric materials may be substituted for the ONO, such as tantalum oxide, barium strontium titanate, silicon nitride and other materials providing dielectric properties.

A control-gate layer 440 is formed overlying the intergate dielectric layer 435 and patterned to define word lines of the memory device. The control gate layer 440 is generally one or more layers of conductive material. For one embodiment, the control gate layer 440 contains a conductively-doped polysilicon. For a further embodiment, the control gate layer 440 includes a metal-containing layer overlying a polysilicon layer, e.g., a refractory metal silicide layer formed on a conductively-doped polysilicon layer. The metals of chromium (Cr), cobalt (Co), hafnium (Hf), molybdenum (Mo), niobium (Nb), tantalum (Ta), titanium (Ti), tungsten (W), vanadium (V) and zirconium (Zr) are generally recognized as refractory metals. For another embodiment, the control gate layer 440 contains multiple metal-containing layers, e.g., a titanium nitride (TiN) barrier layer overlying the intergate dielectric layer 456, a titanium (Ti) adhesion layer overlying the barrier layer and a tungsten (W) layer overlying the adhesion layer.

A cap layer 445 is generally formed overlying the control-gate layer 440 to act as an insulator and barrier layer to protect the control-gate layer 440 during subsequent processing. The cap layer 445 contains a dielectric material and may include such dielectrics as silicon oxide, silicon nitride, and silicon oxynitrides. For one embodiment, the cap layer 445 is silicon nitride, formed by such methods as CVD.

Figure 4I:
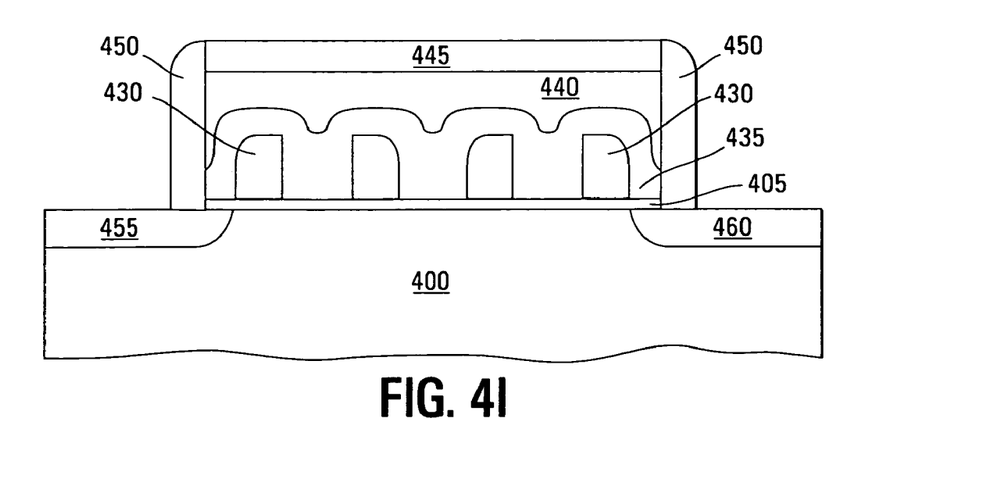

In FIG. 4I, the tunnel dielectric layer 405, the segments 430, the intergate dielectric layer 435, the control-gate layer 440 and the cap layer 445 are patterned to define gate stacks. It is noted that additional layers may form the gate stack, such as barrier layers to inhibit diffusion between opposing layers or adhesion layers to promote adhesion between opposing layers. Sidewall spacers 450 may be formed on the sidewalls of the gate stacks to protect and insulate the sidewalls. Sidewall spacers 450 are generally the same dielectric material as used for the cap layer 445, but may include other dielectric materials. Formation may include a blanket deposit of a layer of dielectric material on the patterned gate stacks followed by an anisotropic etch to preferentially remove horizontal portions of the layer of dielectric material, leaving vertical portions adjacent the sidewalls of the gate stacks.

A first source/drain region 455 and a second source/drain region 460 are formed adjacent the gate stack in the substrate 400. The first source/drain region 455 and second source/drain region 460 are conductive regions having the second conductivity type different from the conductivity type of the substrate 400. The first source/drain region 455 and second source/drain region 460 are generally heavily-doped regions for increased conductivity. For one embodiment, the first source/drain region 455 and second source/drain region 460 are n+-type regions formed by implantation and/or diffusion of n-type dopants, such as arsenic or phosphorus. The edges of the first source/drain region 455 and second source/drain region 460 are generally made to coincide with, or underlap, the edges of the gate stacks. As an example, the first source/drain region 455 and second source/drain region 460 may be formed using angled implants or post-implant anneals to contact the channel region of the gate stack below the tunnel dielectric layer 405. The channel region is that portion of the substrate 400 extending between the first source/drain region 455 and second source/drain region 460 associated with a single gate stack.

The methods in accordance with the invention may be used to produce any number of segments 430. Although four segments 430 were depicted in the example embodiment, two segments 430 would permit a multi-bit cell, i.e., a memory cell capable of storing more than one data value. Although memory cells in accordance with the invention having two or more segments in their floating gate can act as multi-bit memory cells, such structures can also be used to store only one bit per cell. Furthermore, a floating gate having two or more segments in accordance with the invention can facilitate decreased failure rates as localized defects in the tunnel dielectric layer or intergate dielectric layer might short one segment of the floating gate to the substrate or control gate, respectively, without affecting the other segments. In a conventional floating-gate memory cell, a defect in the tunnel dielectric layer or intergate dielectric layer would destroy the memory cell. In a memory cell in accordance with the invention, the memory cell would still be able to store at least one bit if at least one segment of the floating gate remains isolated from the substrate and control gate.

Access operations can be carried out by applying biases to the source, drain and control gate of the transistor. For a single bit cell, write operations might generally be carried out by channel hot-carrier injection. This process induces a flow of electrons between the source and the drain, and accelerates them toward a floating gate in response to a positive bias applied to the control gate.

Read operations would generally include sensing a current between the source and the drain, i.e., the MOSFET current, in response to a bias applied to the control gate. By utilizing forward bias or reverse bias in a multi-bit cell, one or another data value may be read from the cell. Erase operations would generally be carried out through Fowler-Nordheim tunneling. This process may include electrically floating the drain, grounding the source, and applying a high negative voltage to the control gate.

For a multi-bit cell, write operations could be carried out via band-to-band-tunneling-induced substrate hot-electron injection. A programming field is established between the control gate and the first source/drain region to write a first data value to the cell and a programming field is established between the control gate and the second source/drain region to write a second data value to the cell. Using a p-channel memory cell as an example, a negative bias may be applied to the first source/drain region while a positive bias is applied to the control gate as the second source/drain region is floating. In this manner, electron-hole pairs are generated by band-to-band tunneling in the first source/drain region and are accelerated by a lateral electric field toward the channel region and into the floating gate segments localized near the first source/drain region, thus altering the threshold voltage in this region of the memory cell. Conventional floating-gate memory cells may be used to store multiple bits by relying on bands of threshold voltages determined by the absolute charge storage on its floating gate. However, for the various embodiments, multiple-bit storage is alternatively facilitated by isolating segments of the floating gate from other segments of the floating gate, thereby permitting localized charge storage leading to threshold voltage differences in the cell depending upon which direction it is read.

Figure 5:
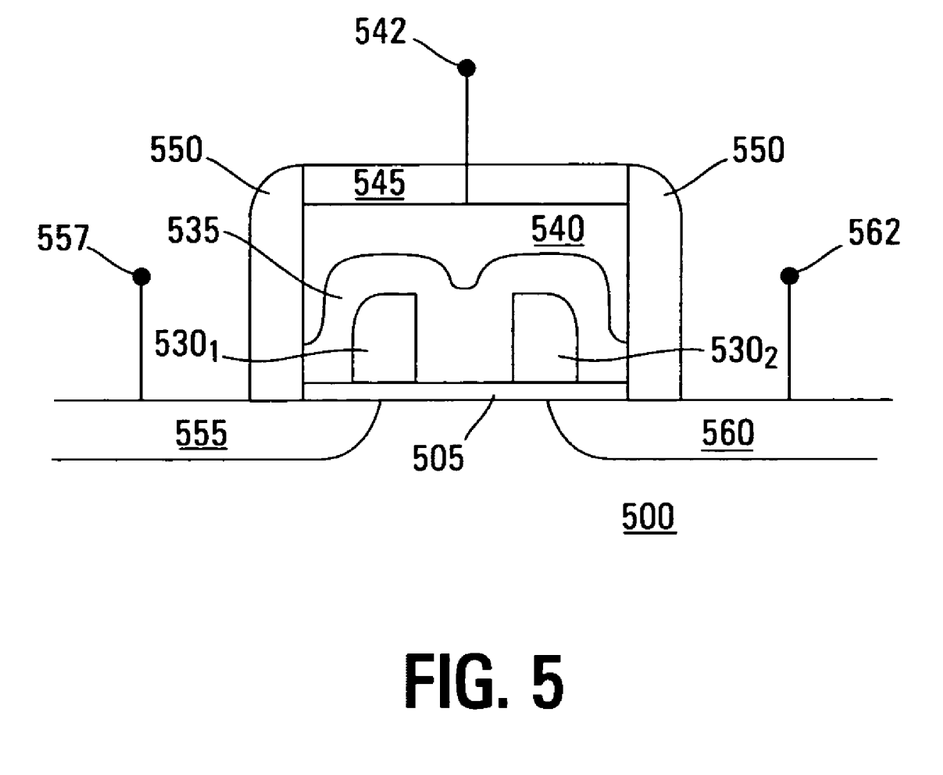
FIG. 5 is a cross-sectional view of a memory cell of another embodiment of the invention.

This concept of programming multiple bits into the floating-gate memory cell is demonstrated with reference to FIG. 5 showing a memory cell in accordance with an embodiment of the invention having two segments 530 in its floating gate. The memory cell is formed overlying a substrate 500 and includes a tunnel dielectric layer 505, floating gate segments $530_1$ and $530_2$, intergate dielectric layer 535, and control gate layer 540. Associated cap layer 545 and sidewall spacers 550 provide isolation of the memory cell from adjacent structures. Other voltage differentials can be used to create the programming field.

For programming a first data value, charge can be stored in a first floating-gate segment $530_1$, such as by establishing a programming field between the control gate 540 and the first source/drain region 555. For example, a first potential can be applied at node 542 and a second potential can be applied at node 557 while node 562 is floating. Node 542 conceptually represents the word line, of which control gate 540 is a part. Node 557 conceptually represents, for example, a source line while node 562 conceptually represents, for example, a bit line. In this manner, a charge may be stored in the floating-gate segment $530_1$ without materially affecting the charge level of the floating-gate segment $530_2$. Although only two floating-gate segments 530 are shown in FIG. 5, it will be recognized that additional segments 530 could be utilized using these same concepts. The segments 530 closer to the first source/drain regions 555 would receive higher charge levels than those farther away.

For programming a second data value, charge can be stored in the second floating-gate segment $530_2$, such as by establishing a programming field between the control gate 540 and the second source/drain region 560. For example, the first potential can be applied at node 542 and the second potential can be applied at node 562 while node 557 is floating. In this manner, a charge may be stored in the floating-gate segment $530_2$ without materially affecting the charge level of the floating-gate segment $530_1$. Similar to the process noted with respect to programming the first data value in a memory cell having more than two floating-gate segments 530, the segments 530 closer to the second source/drain regions 560 would receive higher charge levels than those farther away.

By reading a multi-bit cell biased in the forward direction, e.g., with the first source/drain region 555 acting as the source, the data value stored in the floating gate segments $530_1$ near the first source/drain region may be sensed. By reading this cell biased in the reverse direction, e.g., with the first source/drain region 555 acting as the drain, the data value stored in the floating gate segments $530_2$ near the second source/drain region 560 may be sensed.

CONCLUSION

Floating-gate memory cells having a split floating gate facilitate decreased sensitivity to localized defects in the tunnel dielectric layer and/or the intergate dielectric layer. Such memory cells also permit storage of more than one bit per cell. Methods of the various embodiments facilitate fabrication of floating gate segments having dimensions less than the capabilities of the lithographic processed used to form the gate stacks.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of forming a floating gate for a floating-gate memory cell, comprising:
    forming a support layer overlying a tunnel dielectric layer, wherein a portion of the tunnel dielectric layer forms a tunnel dielectric of the floating-gate memory cell;
    forming a cap layer overlying the support layer;
    patterning the cap layer and support layer, leaving the tunnel dielectric layer intact;
    removing a portion of the support layer under the patterned cap layer;
    removing the cap layer;
    forming spacers on sidewalls of a remaining portion of the support layer, wherein the spacers are formed of a material capable of storing a charge; and
    removing the remaining portion of the support layer.

2. The method of claim 1, wherein forming a support layer further comprises forming a layer of carbon.

3. The method of claim 2, wherein forming a layer of carbon further comprises forming a layer of carbon by chemical vapor deposition or physical vapor deposition.

4. The method of claim 3, wherein forming a layer of carbon by chemical vapor deposition further comprises forming a layer of carbon by chemical vapor deposition using a hydrocarbon gas as a carbon source.

5. The method of claim 1, wherein removing a portion of the support layer under the patterned cap layer further comprises isotropically removing a portion of the support layer.

6. The method of claim 5, wherein isotropically removing a portion of the support layer further comprises dry etching the support layer.

7. The method of claim 5, wherein isotropically removing a portion of the support layer further comprises exposing a carbon support layer to an oxygen plasma etch.

8. The method of claim 7, further comprising wherein removing the remaining portion of the support layer further comprises exposing the remaining portion of the carbon support layer to an oxygen plasma etch.

9. The method of claim 1, wherein forming spacers on sidewalls of a remaining portion of the support layer further comprises depositing a layer of material on the remaining portion of the support layer and anisotropically removing portions of the layer of material.

10. The method of claim 9, wherein depositing a layer of material further comprises depositing a layer of polysilicon.

11. A method of forming a floating gate for a floating-gate memory cell, comprising:
    forming a support layer overlying a tunnel dielectric layer, wherein a portion of the tunnel dielectric layer forms a tunnel dielectric of the floating-gate memory cell;
    forming a cap layer overlying the support layer;
    patterning the cap layer and support layer, leaving the tunnel dielectric layer intact;
    isotropically removing a portion of the support layer under the patterned cap layer;
    removing the cap layer;
    forming a floating-gate layer overlying a remaining portion of the support layer;
    anisotropically removing a portion of the floating-gate layer to expose the remaining portion of the support layer, thereby forming spacers on sidewalls of the remaining portion of the support layer; and
    removing the remaining portion of the support layer.

12. The method of claim 11, wherein forming a floating-gate layer further comprises forming a layer of doped or undoped silicon material selected from the group consisting of polysilicon, monocrystalline silicon, nanocrystalline silicon and amorphous silicon.

13. A method of forming a floating-gate memory cell, comprising:
    forming a tunnel dielectric layer overlying a semiconductor substrate, wherein a portion of the tunnel dielectric layer forms a tunnel dielecteic of the floating-gate memory cell;
    forming a support layer overlying the tunnel dielectric layer;
    forming a cap layer overlying the support layer;
    patterning the cap layer and support layer to expose portions of the tunnel dielectric layer while leaving the tunnel dielectric layer intact;
    isotropically removing a portion of the support layer under the cap layer, thereby exposing a further portion of the tunnel dielectric layer;
    removing the cap layer;
    forming a floating-gate layer overlying a remaining portion of the support layer;
    anisotropically removing a portion of the floating-gate layer, thereby forming segments of the floating-gate layer adjacent the remaining portion of the support layer;
    removing the remaining portion of the support layer;
    forming an intergate dielectric layer overlying the segments of the floating-gate layer; and
    forming a control gate layer overlying the intergate dielectric layer.

14. The method of claim 13, wherein forming an intergate dielectric layer overlying the segments of the floating-gate layer further comprises forming the intergate dielectric layer to have at least a portion interposed between segments of the floating-gate layer and contacting the tunnel dielectric layer.

15. The method of claim 13, wherein forming a floating-gate layer further comprises forming a layer of material capable of storing a charge.

16. The method of claim 15, wherein forming a layer of material capable of storing a charge further comprises forming a layer of doped or undoped silicon material selected from the group consisting of polysilicon, monocrystalline silicon, nanocrystalline silicon and amorphous silicon.

17. A method of forming a floating gate for a floating-gate memory cell, comprising:
- forming a layer of carbon overlying a tunnel dielectric layer, wherein a portion of the tunnel dielectric layer forms a tunnel dielectric of the floating-gate memory cell;
- forming a cap layer overlying the layer of carbon;
- patterning the cap layer and layer of carbon, leaving the tunnel dielectric layer intact;
- isotropically removing a portion of the layer of carbon under the patterned cap layer;
- removing the cap layer;
- forming spacers on sidewalls of a remaining portion of the layer of carbon, wherein the spacers are formed of a material capable of storing a charge; and
- removing the remaining portion of the layer of carbon.

18. The method of claim 17, wherein isotropically removing a portion of the layer of carbon further comprises dry etching the layer of carbon.

19. The method of claim 17, wherein isotropically removing a portion of the layer of carbon and removing the remaining portion of the layer of carbon comprises using the same type of process for both removals of carbon.

20. The method of claim 17, wherein forming spacers on sidewalls of a remaining portion of the layer of carbon further comprises forming a layer of charge-storage material on the remaining portion of the layer of carbon and anisotropically removing portions of the layer of charge-storage material.

21. The method of claim 20, wherein forming a layer of charge-storage material further comprises forming a layer of polysilicon.

22. The method of claim 20, wherein forming a layer of charge-storage material further comprises forming a layer of polysilicon.

23. A method of forming a floating-gate memory cell, comprising:
- forming a tunnel dielectric layer overlying a semiconductor substrate, wherein a portion of the tunnel dielectric layer forms a tunnel dielectric of the floating-gate memory cell;
- forming a layer of carbon overlying the tunnel dielectric layer;
- forming a cap layer overlying the layer of carbon;
- patterning the cap layer and layer of carbon to expose portions of the tunnel dielectric layer while leaving the tunnel dielectric layer intact;
- isotropically removing a portion of the layer of carbon under the cap layer, thereby exposing a further portion of the tunnel dielectric layer;
- removing the cap layer;
- forming a layer of charge-storage material overlying a remaining portion of the layer of carbon;
- anisotropically removing a portion of the layer of charge-storage material, thereby forming spacers of charge-storage material adjacent the remaining portion of the layer of carbon;
- removing the remaining portion of the layer of carbon;
- forming an intergate dielectric layer overlying the spacers of charge-storage material; and
- forming a control gate layer overlying the intergate dielectric layer.

24. The method of claim 23, wherein isotropically removing a portion of the layer of carbon further comprises subjecting the layer of carbon to an oxygen plasma etch.

25. The method of claim 24, wherein removing the remaining portion of the layer of carbon comprises subjecting the remaining portion of the layer of carbon to an oxygen plasma etch.

* * * * *

UNITED STATES PATENT AND TRADEMARK OFFICE
CERTIFICATE OF CORRECTION

PATENT NO. : 7,547,599 B2  Page 1 of 1
APPLICATION NO. : 11/138575
DATED : June 16, 2009
INVENTOR(S) : Gurtej S. Sandhu et al.

It is certified that error appears in the above-identified patent and that said Letters Patent is hereby corrected as shown below:

In column 10, line 30, in Claim 13, delete "dielecteic" and insert -- dielectric --, therefor.

Signed and Sealed this

Twenty-eighth Day of July, 2009

JOHN DOLL
*Acting Director of the United States Patent and Trademark Office*